United States Patent
Wertz

(10) Patent No.: US 9,459,295 B2
(45) Date of Patent: Oct. 4, 2016

(54) MEASUREMENT SYSTEM UTILIZING A FREQUENCY-DITHERED LOCAL OSCILLATOR

(71) Applicant: NATIONAL INSTRUMENTS CORPORATION, Austin, TX (US)

(72) Inventor: Daniel S. Wertz, Sebastopol, CA (US)

(73) Assignee: National Instruments Corporation, Austin, TX (US)

( * ) Notice: Subject to any disclaimer, the term of this patent is extended or adjusted under 35 U.S.C. 154(b) by 424 days.

(21) Appl. No.: 13/938,495

(22) Filed: Jul. 10, 2013

(65) Prior Publication Data

US 2015/0015238 A1    Jan. 15, 2015

(51) Int. Cl.
*H03B 28/00* (2006.01)
*G01R 23/16* (2006.01)
*G01R 27/28* (2006.01)

(52) U.S. Cl.
CPC ............. *G01R 23/16* (2013.01); *G01R 27/28* (2013.01); *H03B 28/00* (2013.01)

(58) Field of Classification Search
CPC ...... G01R 23/16; G01R 27/28; H04B 17/00; H04B 1/68; H03B 28/00; H03C 1/60; H03J 1/005; H03J 7/065; H03L 7/23
USPC ............... 324/76.19, 537; 375/224
See application file for complete search history.

(56) References Cited

U.S. PATENT DOCUMENTS

| | | | |
|---|---|---|---|
| 7,107,022 B1 * | 9/2006 | Thomas | H03C 1/60 375/344 |
| 7,143,125 B2 | 11/2006 | Gradishar et al. | |
| 7,421,464 B2 | 9/2008 | Gradishar et al. | |
| 7,786,913 B2 | 8/2010 | Waheed et al. | |
| 7,889,120 B2 | 2/2011 | Flaszа | |
| 8,269,563 B2 | 9/2012 | Ballantyne | |
| 2007/0082640 A1 * | 4/2007 | Kim | 455/255 |
| 2011/0159819 A1 * | 6/2011 | Yanni | H03J 1/005 455/67.11 |
| 2012/0027063 A1 * | 2/2012 | Wertz | H04B 17/21 375/224 |
| 2012/0092205 A1 * | 4/2012 | Bourdelais et al. | 342/21 |
| 2012/0269288 A1 * | 10/2012 | Olgaard | H04L 1/24 375/296 |

* cited by examiner

*Primary Examiner* — Son Le
*Assistant Examiner* — Brent J Andrews
(74) *Attorney, Agent, or Firm* — Meyertons Hood Kivlin Kowert & Goetzel, P.C.; Jeffrey C. Hood

(57) ABSTRACT

An improved receiver system may include an input to receive an input signal, and a signal generating circuit to generate a desired oscillator signal that is a single sideband radio frequency signal of time varying frequency. The receiver may also include a downconversion stage to generate an intermediate frequency (IF) signal based on the input signal and the desired oscillator signal. A signal processing block in the receiver may be used to produce an output signal based on the IF signal by frequency shifting the IF signal by an amount that compensates for the time varying frequency of the desired oscillator signal. The desired oscillator signal may be generated using a vector signal generator that receives a control value from the signal processing block, converts the control value to a pair of analog input signals, and generates the desired oscillator signal by quadrature modulating the pair of analog input signals.

18 Claims, 4 Drawing Sheets

MEASUREMENT SYSTEM UTILIZING A FREQUENCY-DITHERED LOCAL OSCILLATOR

FIELD OF THE INVENTION

The present invention relates to the field of instrumentation, and more particularly to using a dithered local oscillator when making narrow resolution bandwidth vector signal analyzer measurements.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

One widely used instrumentation device, for example, is a spectrum analyzer, which is used to measure the magnitude versus frequency of an input signal, within the full frequency range of the instrumentation device. Spectrum analyzers are primarily used for measuring the spectral power of known and unknown signals. While spectrum analyzers typically receive an electrical input signal, the spectral compositions of other types of signals, e.g. optical light waves and/or acoustic pressure waves may also be determined, by generating corresponding electrical signals—to be provided as input into the spectrum analyzer—through appropriate transducers. By analyzing the spectra of various (electrical) signals, those characteristics of the signals that are not easily detectable in the time domain—e.g. dominant frequency, power, distortion, harmonics, bandwidth, and other spectral components—may be determined. These parameters are useful in the characterization of electronic devices, such as wireless transmitters, for example. One basic type of spectrum analyzer is the vector signal analyzer (VSA).

A VSA is used for measuring the magnitude and phase of the input signal at a single frequency within the IF (intermediate frequency) bandwidth of VSA, which includes making in-channel measurements, such as error vector magnitude, code domain power, and spectral flatness, of known signals. The VSA spectrum analysis process typically includes a down-converting/digitizing stage and a DSP (digital signal processing)/display stage. Accordingly, a VSA is first used to downconvert a portion of the input signal spectrum, typically using a VCO (voltage-controlled oscillator) and a mixer) to the center frequency of a bandpass filter. Using a voltage-controlled oscillator facilitates consideration of different carrier frequencies. Following conversion to an IF, the signal is band limited by performing filtering the signal, which also prevents aliasing. The signal is then digitized using an ADC (analog-to-digital converter), the sampling rate of which may be varied in relation to the frequency span under consideration.

For spectrum analysis, it is highly desirable to have a receiver that does not have any internally generated spurious responses. Spurious responses in the receiver are observed in the output of the spectrum analyzer, and although they appear like input signals, they aren't actually present. This is an undesirable characteristic for a spectrum analyzer. In modern high performance spectrum analyzers, engineers typically go to great lengths in order to ensure good spurious performance. Measures undertaken to ensure goof performance include multiple downconversions, filters, shielding, and spur dodging techniques. The result is usually a very complex, large, and expensive product.

Other corresponding issues related to the prior art will become apparent to one skilled in the art after comparing such prior art with the present invention as described herein.

SUMMARY OF THE INVENTION

In one set of embodiments, a VSA (vector signal analyzer) may include a novel circuit topology for the LO (local oscillator), combined with signal processing to spread spectrum the energy from the majority of spurs in a receiver over a broad frequency range. This results in causing discrete spurs to appear like white noise. The novel LO facilitates spreading mixer input and ADC input related spurs, as well as fixed frequency spurs such as ADC interleaving spurs. Once the spurs appear like noise, the resolution bandwidth of the receiver system may be narrowed to handle and process signals at lower levels than would otherwise be possible. For certain applications, this may also allow transforming inexpensive hardware into a high performance spectrum analysis solution. The technique may also be applied to high performance hardware to achieve new levels of performance, and may be used for signal generation to improve the spurious performance of signal generators for certain applications.

In one set of embodiments, a frequency agile LO may be used for the receiver, mixer or demodulator (e.g. in a VSA), and the resulting IF may be tracked using DSP frequency shift operations. Any signal in the IF that moves one-for-one in frequency with the LO may be tracked by the DSP, and may remain stationary in the digital baseband signal. None of the other signals remain stationary in the digital baseband, and tend to be spread in frequency, and average to zero, for long acquisitions or narrow resolution bandwidths.

One possible way in which a frequency agile LO may be generated is through the use of a VSG (vector signal generator) for generating the LO used by the receiver (for example in a VSA). While it may appear excessive to use a VSG simply to generate a frequency agile LO signal, it is not difficult to prototype the requisite topology using certain already available tools, such as the National Instruments NI-5791 RF FAM (FlexRIO Adapter Module) for example. When using the RF FAM, the internal CW (continuous wave) LO may be routed to the TX (transmit) modulator in the FAM. The TX modulator output may then be routed back into the external LO input for the FAM, and the RX (receive) demodulator may be setup to use the external LO input for the receiver oscillator signal. In general, an FPGA (field programmable gate array) may be used to drive the baseband DACs (digital to analog converters) in the FAM to generate a desired oscillator signal that is a single sideband RF (radio frequency) output of time varying frequency. The data received by the receiver (also referred to as the receive data) from the analog to digital converters (ADC) may be frequency shifted to compensate for the time varying frequency of the baseband DACs.

There may be a variety of different functions from which a frequency-versus-time function may be selected for use for the baseband DACs. For example, use of an extremely simple linear frequency sweep may be effective. There may be a delay from when a frequency change of the baseband DACs is seen in the baseband ADCs. The delay may include the delay in the DAC reconstruction filters, the delay in the ADC anti-alias filters, and the electrical delay in the line length between the modulator output and the demodulator LO port. One advantage to using a simple linear sweep function is that the delay simply causes an apparent frequency shift if it is not accounted for. For other more complicated frequency profiles, the delay may be taken into account when frequency shifting the ADC data. There may also be a phase shift in the RX data as a function of the baseband DAC frequency and the electrical length between the modulator output and demodulator LO input.

In one set of embodiments, the receiver may be a direct conversion receiver. In other embodiments, a super heterodyne receiver may be used, in which case, the frequency-dithered LO may be applied to any of the mixers. The signal path downstream from the chosen mixer may become frequency-dithered. For example, with an NI-5665 part, the 4 GHz second LO may be frequency-dithered, which would result in the second IF (intermediate frequency), third IF, and the ADC all being dithered. If, on the other hand, the 800 MHz third LO were dithered, then the third IF and the ADC would be frequency-dithered.

It should be noted that various embodiments of the spur reduction technique described herein are most effective against CW or narrow band spurs. Images or mixer products of broadband digital modulated signals are already noise like, and may need to be spread to a much higher degree than CW signals, in order to obtain equivalent degrees or levels of spur reduction. Furthermore, using a dithered LO as described herein provides substantial spur reduction when the spectrum can be widely spread compared to the final resolution BW (bandwidth) of the measurement. However, there may also be embodiments in which a combination of averaging may be used with a dithered LO to improve EVM (error vector magnitude) measurements.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
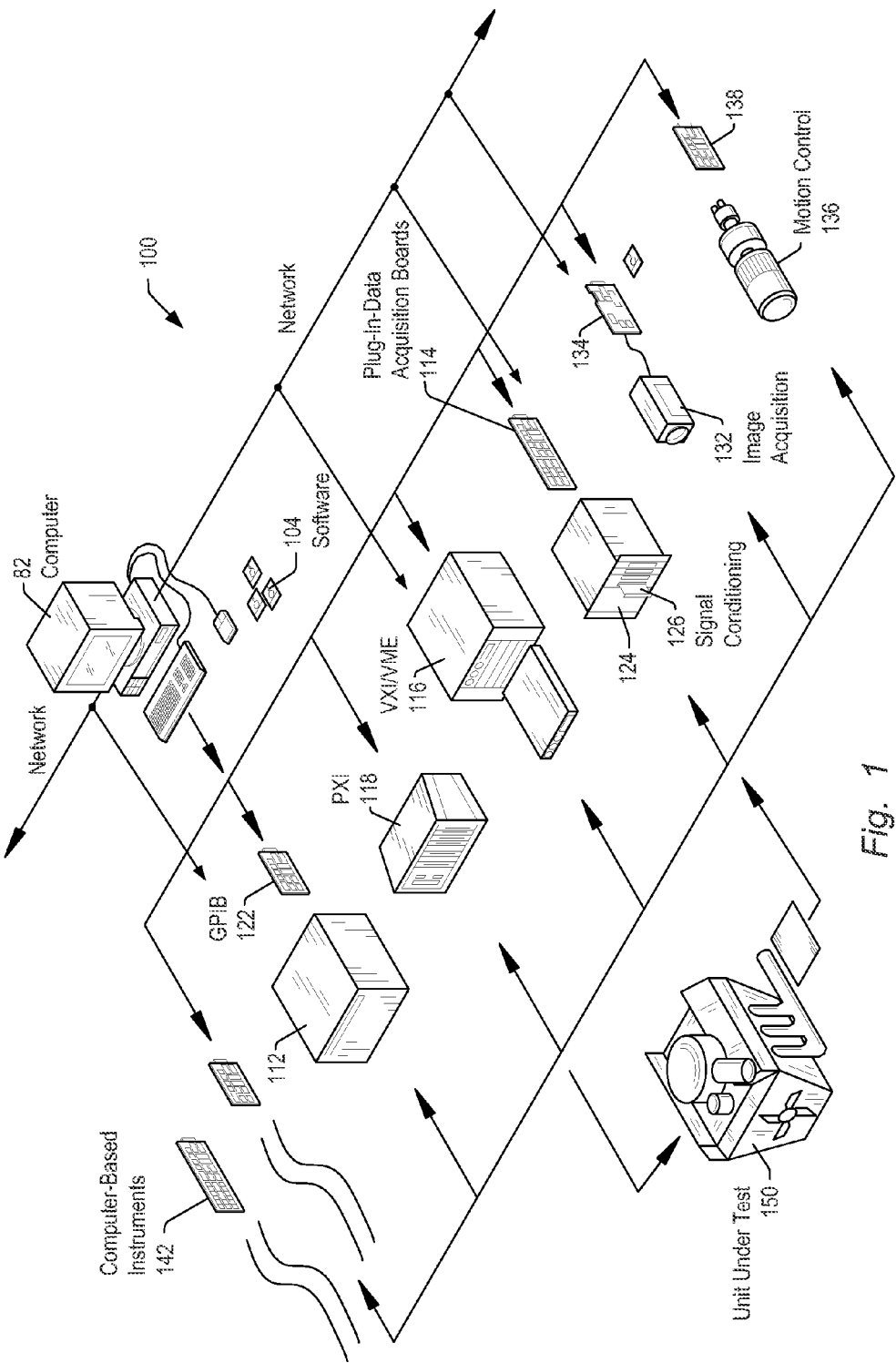
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. More specifically, it may be used in various instances where input protection for instrumentation equipment is required, without degrading the performance of the protected instrumentation equipment. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention may be used in any number of different applications. It is noted that the various terms or designations for circuits/components as they appear herein, such as "feedback circuit", "measurement circuit", etc. are merely names or identifiers used to distinguish among the different circuits/components, and these terms are not intended to connote any specific, narrowly construed meaning, unless specifically noted otherwise.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
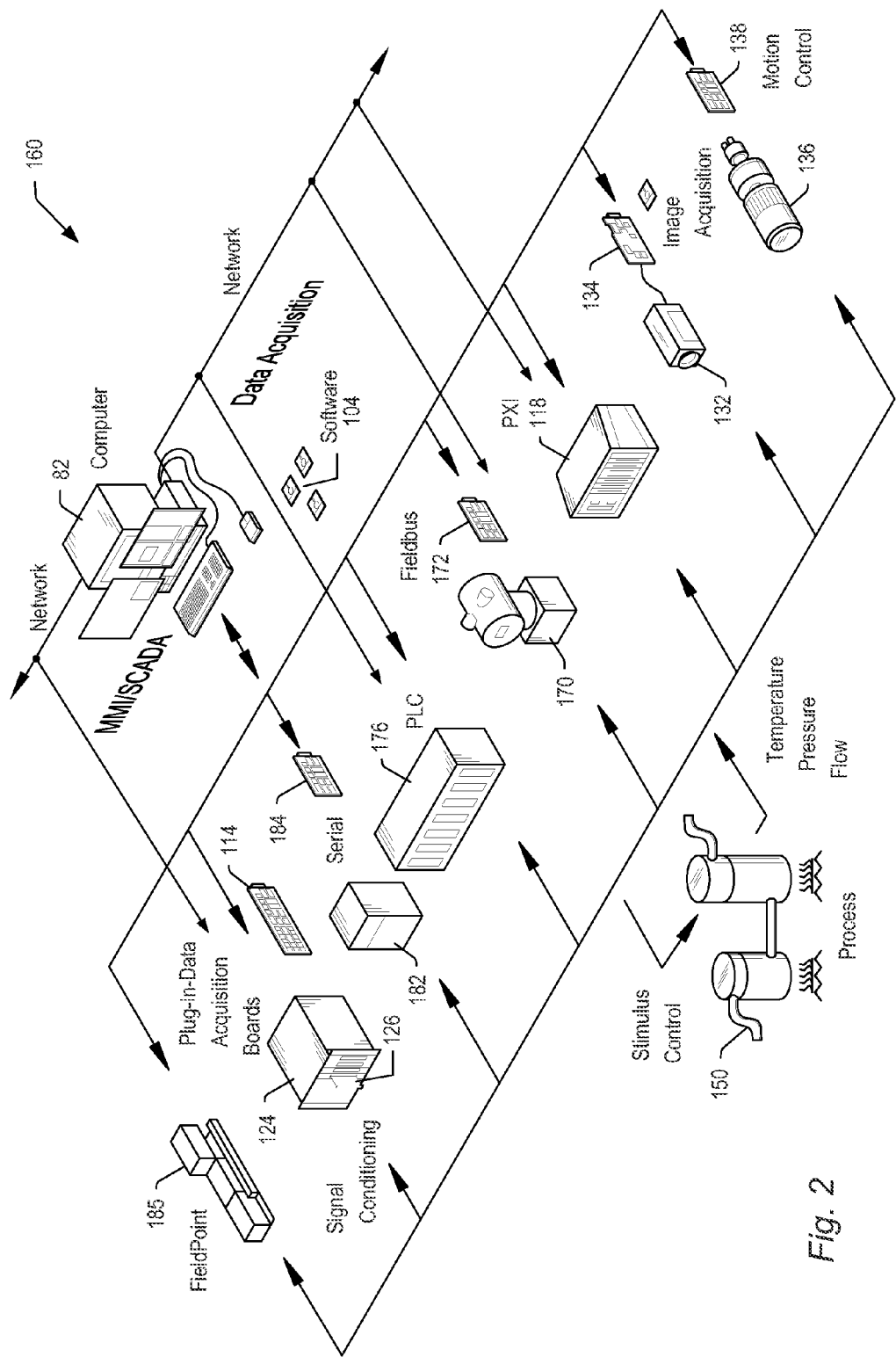
FIG. 2 shows an industrial automation system with instruments networked together according to one embodiment of the invention.

FIG. 2 illustrates an exemplary industrial automation system 160 that may be configured according to embodiments of the present invention. Industrial automation system 160 may be similar to instrumentation or test and measurement system 100 shown in FIG. 2A. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 3:
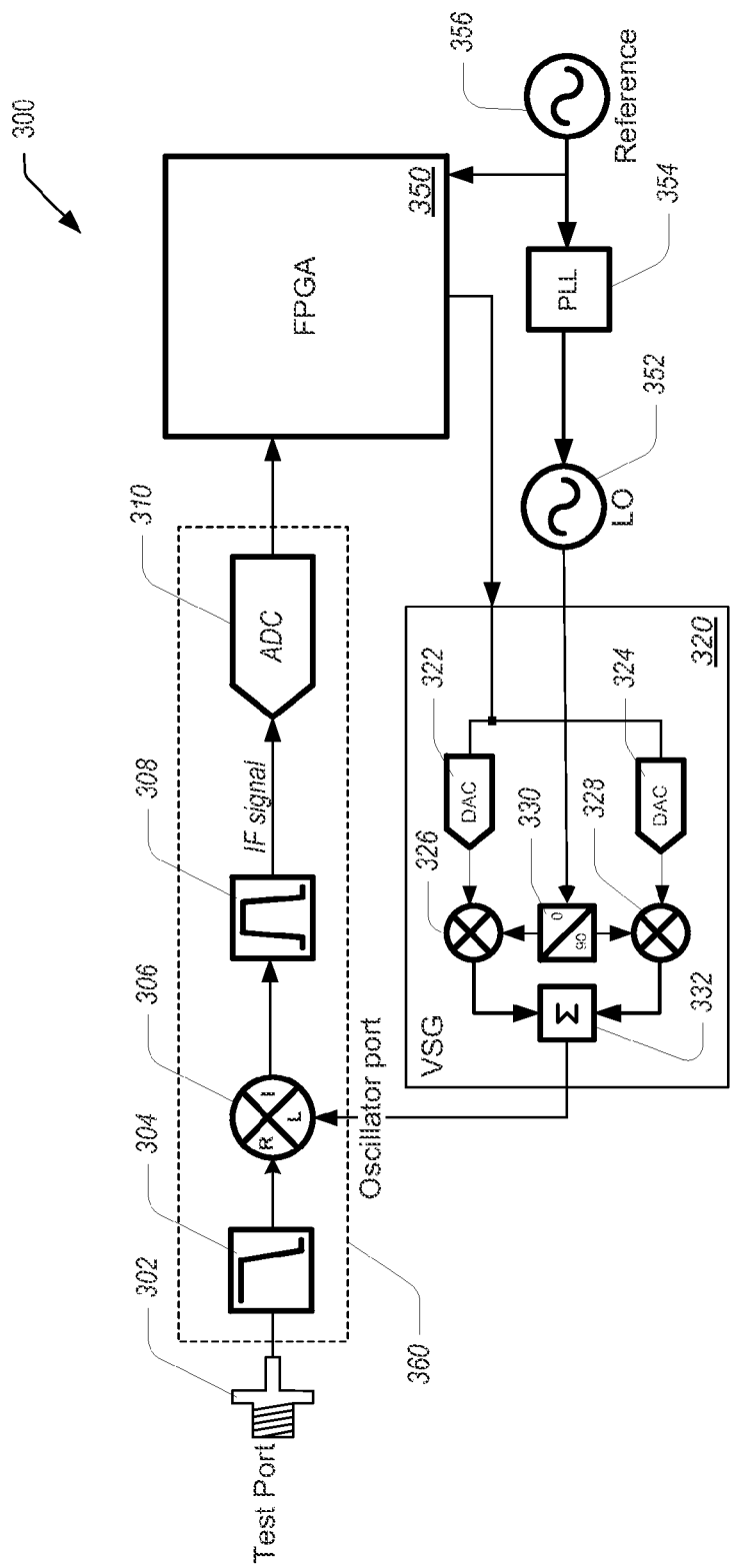
FIG. 3 shows a simplified block diagram of one embodiment of a novel receiver circuit in which a vector signal generator is used to generate a frequency-dithered oscillator signal.

In some embodiments, measurement or measuring instruments and devices, such as those shown in FIG. 1, may include a VSG (vector signal generator) and/or VSA (vector signal analyzer). Moreover, the VSA may use a dithered LO (local oscillator) as will be further described with respect to FIG. 3, which shows a simplified block diagram of a VSA 300. Because FIG. 3 is a simplified block diagram, various embodiments may include additional components, e.g. stages, and may be configured slightly differently, while still including the various novel features that will be further described below, and which FIG. 3 is intended to convey in the context of the embodiment of VSA 300. As shown in FIG. 3, VSA 300 may receive an input signal at test port 302, and may include a single downconversion stage 360. The downconversion stage 306 may include a low-pass filter 304, a mixer 306, a bandpass filter 308, and an analog-to-digital converter (ADC) 310 to provide a digital representation of the downconverted signal to digital signal processing element 350, which is shown in FIG. 3 as being implemented in an FPGA.

VSA 300 also includes a VSG 320 for driving the LO port of the mixer 306 within down conversion stage 360. A measurement using VSA 300 may be performed by first setting the LO frequency (352), and then using the DACs 322/324 in VSG 320 to generate a single sideband signal of time varying frequency while simultaneously acquiring a series of ADC samples from ADC 310. Since the instantaneous frequency and phase of the single sideband LO signal generated by VSG 320 and provided to mixer 306 is known for each ADC sample, signal processing (performed in FPGA 350) may be used to take this instantaneous frequency and phase into account. This special signal processing may result in frequency shifting the data, thereby undoing the effects of the frequency shift in the LO signal provided to mixer 306. The benefit of performing the aforementioned signal processing is that many of the spurious responses in the VSA 300 do not move one-for-one with the frequency of the LO signal provided to mixer 306. Accordingly, the DSP operation to undo the LO frequency shift leaves the spurious responses varying in frequency and phase as a function of time. By averaging large amounts of data, the time-varying spurious responses will tend to average to zero, or appear as low-level broadband noise.

In other words, a novel circuit topology for generating the LO signal (provided to mixer 306 in the VSA embodiment shown in FIG. 3) may be combined with signal processing (performed in FPGA 350 in the VSA embodiment shown in FIG. 3) to spread spectrum the energy from the majority of spurs in a receiver over a broad frequency range. By spreading the energy spectrum from the spurs, discrete spurs appear in the system like white noise, which facilitates spreading mixer input related spurs and ADC-input related spurs, as well as fixed frequency (e.g. ADC interleaving) spurs. Once the spurs appear like low-level white noise, the resolution bandwidth of the receiver system may be narrowed to process signals at lower levels than what would otherwise be possible. As shown in FIG. 3, a frequency agile LO may be used for a receiver, mixer or demodulator, exemplified in FIG. 3 by VSA 300. The resulting IF may be tracked using DSP frequency shift operations, performed in FPGA 350, as also exemplified in FIG. 3. Any signal in the IF (i.e. the signal provided from ADC 310 to FPGA 350) that moves one-for-one in frequency with the LO may be tracked by the DSP (within FPGA 350), and may remain stationary in the digital baseband signal. The other signals tend not to remain stationary in the digital baseband and are therefore spread in frequency, averaging to zero for long acquisitions or narrow resolution bandwidths.

As shown in FIG. 3, one way of generating a frequency agile LO is through the use of VSG 320 for generating the LO of the receiver, exemplified (in a simplified manner) by down conversion stage 360. As shown in FIG. 3, an continuous wave LO 352 may be generated from a reference signal 356 through a PLL (phase locked loop) 354, and may routed to the transmit modulator (326, 330, 328, 332) in VSG 320. The output from 332 may then be routed into the LO input for the down converter stage 360 to mixer 306. Using FPGA 350, the baseband DACs 322 and 324 in VSG 320 may be driven to generate a single sideband RF (radio frequency) output of time varying frequency. The data received by FPGA 350 from ADC 310 may be frequency shifted to compensate for the time varying frequency of the baseband DACs 322 and 324.

There may be a variety of different functions from which a frequency-versus-time function may be selected for use for the baseband DACs 322 and 324. In some embodiments, FPGA 350 may be configured to perform a simple linear frequency sweep. There may be a delay from when a frequency change of the baseband DACs 322 and 324 is seen in the baseband ADC 310. The delay may include the delay in the DAC reconstruction filters (in DACs 322 and 324), the delay in the ADC anti-alias filters (in ADC 310), and the electrical delay in the line length between the modulator output and the demodulator LO port. One advantage of using a linear sweep function is that the delay simply causes an apparent frequency shift if it is not accounted for. For other more complicated frequency profiles, the delay may be taken into account when frequency shifting the data associated with ADC 310. There may also be a phase shift in the receive data as a function of the baseband DAC frequency and the electrical length between the modulator output and demodulator LO input.

In one set of embodiments, the receiver may be a direct conversion receiver. In other embodiments, a super heterodyne receiver may be used, in which case, the frequency-dithered LO may be applied to any of the mixers. The signal path downstream from the chosen mixer may become frequency-dithered. For example, with an NI-5665 part, the 4 GHz second LO may be frequency-dithered, which would result in the second IF (intermediate frequency), third IF, and the ADC all being dithered. If, on the other hand, the 800 MHz third LO were dithered, then the third IF and the ADC would be frequency-dithered.

Figure 4:
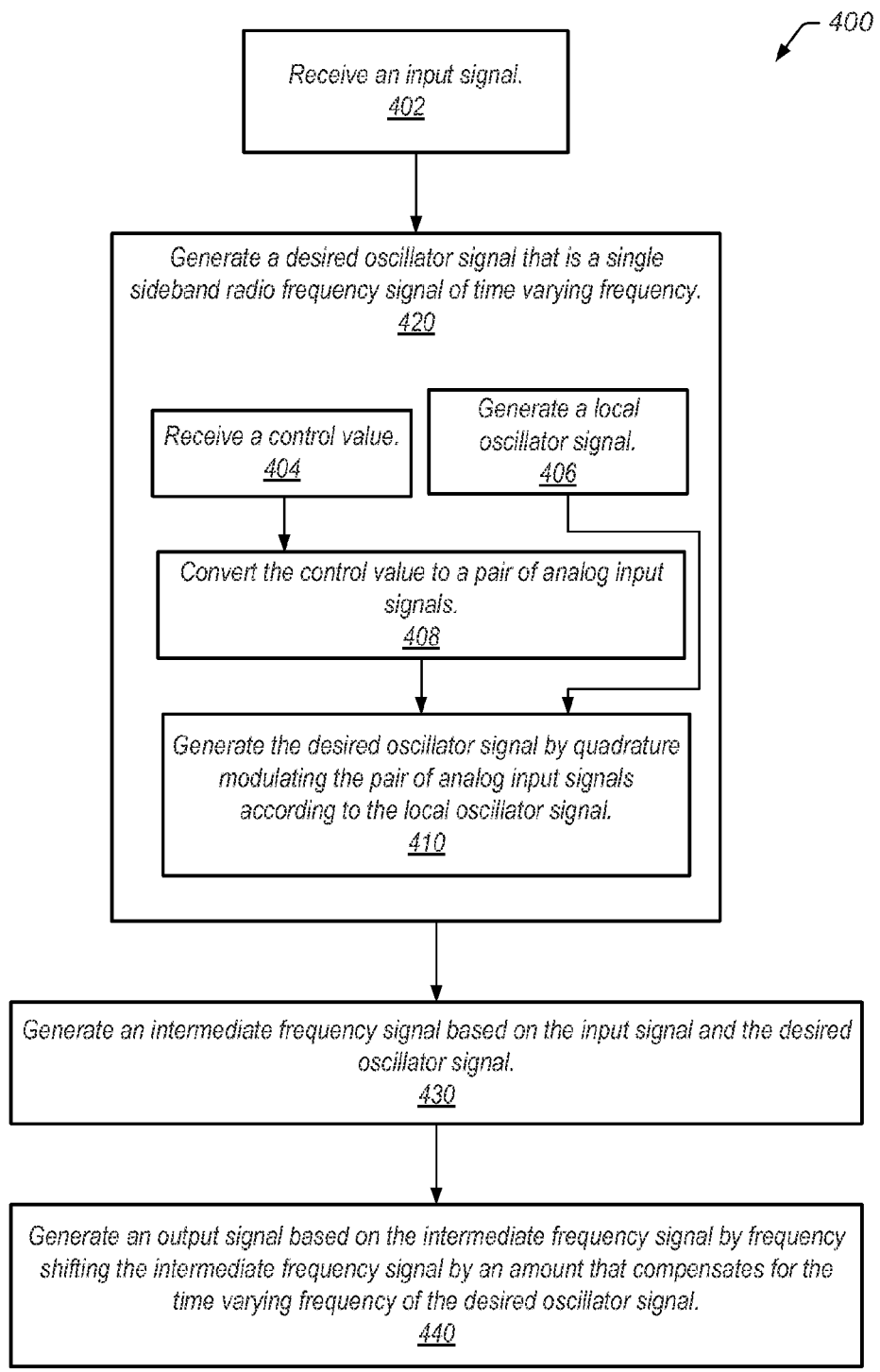
FIG. 4 shows a flow diagram illustrating one embodiment of a method for receiving and processing a radio frequency input signal.

FIG. 4 shows the flow diagram 400 of one embodiment of a method for receiving and processing an input signal, for example in a radio frequency receiver. As shown in FIG. 4, an input signal is received (402), and a desired oscillator signal is generated, whereby the desired oscillator signal is a single sideband radio frequency signal of time varying frequency (420). In some embodiments, the desired oscillator signal may be generated based on a local oscillator signal (e.g. a continuous wave oscillator signal) and a control value. Accordingly, a local oscillator signal may be generated (406), and a control value may be received (404), for example in a vector signal generator. The control value may then be converted to a pair of analog input signals (408), and the desired oscillator signal may be produced by quadrature modulating the pair of analog input signals according to the local oscillator signal (e.g. in the vector signal generator). An intermediate frequency signal may then be generated bas on the input signal and the desired oscillator signal (430), and an output signal (corresponding to the input signal) may be generated based on the intermediate frequency signal by frequency shifting the intermediate frequency signal by an amount that compensates for the time varying frequency of the desired oscillator signal (440).

It should be noted that various embodiments of the spur reduction technique described herein are most effective against CW or narrow band spurs. Images or mixer products of broadband digital modulated signals are already noise like, and may need to be spread to a much higher degree than CW signals, in order to obtain equivalent degrees or levels of spur reduction. Furthermore, using a dithered LO as described herein provides substantial spur reduction when the spectrum can be widely spread compared to the final resolution BW (bandwidth) of the measurement. However, there may also be embodiments in which a combination of averaging may be used with a dithered LO to improve EVM (error vector magnitude) measurements.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A receiver system comprising:
   an input configured to receive an input signal;
   a signal generating circuit configured to generate a desired oscillator signal that is a single sideband radio frequency (RF) signal, wherein an oscillation frequency of the desired oscillator signal shifts over time;
   a downconversion stage configured to generate an intermediate frequency (IF) signal based on the input signal and the desired oscillator signal; and
   a signal processing block configured to produce an output signal based on the IF signal, wherein in generating the output signal, the signal processing block is configured to track any signal in the IF that moves one-for-one in frequency with the desired oscillator signal by frequency shifting receive data corresponding to the IF signal by an amount that compensates for a shift of the oscillation frequency of the desired oscillator signal.

2. The receiver system of claim 1, wherein the signal generating circuit comprises a vector signal generator (VSG) configured to generate the desired oscillator signal based on a continuous wave oscillator (CWO) signal.

3. The receiver system of claim 2, wherein the VSG is further configured to generate the desired oscillator signal further based on a control value received from the signal processing block.

4. The receiver system of claim 3, wherein the VSG comprises:

a pair of digital to analog converters (DACs) configured to convert the control value to a pair of respective analog input signals; and a quadrature modulator configured to produce the desired oscillator signal from the pair of analog input signals according to the CWO signal.

5. The receiver system of claim 3, wherein the signal processing block is configured to generate the control value according to a frequency-versus-time function.

6. The receiver system of claim 5, wherein the frequency-versus-time function is selectable from among a plurality of functions within the signal processing block.

7. The receiver system of claim 5, wherein the frequency-versus-time function is representative of a simple linear frequency sweep.

8. The receiver system of claim 2, further comprising a phase locked loop configured to generate the CWO signal based on a periodic reference signal.

9. The receiver system of claim 1, wherein the signal processing block is further configured to account for various delays present in the signal generating circuit and the downconversion stage when frequency shifting the receive data corresponding to the IF signal.

10. A method for receiving and processing an input signal, the method comprising:

receiving an input signal;

generating a desired oscillator signal that is a single sideband radio frequency (RF) signal, wherein an oscillation frequency of the desired oscillator signal shifts over time;

generating an intermediate frequency (IF) signal based on the input signal and the desired oscillator signal; and generating an output signal based on the IF signal, said generating the output signal comprising tracking any signal in the IF that moves one-for-one in frequency with the desired oscillator signal, said tracking comprising frequency shifting receive data corresponding to the IF signal by an amount that compensates for a shift of the oscillation frequency of the desired oscillator signal.

11. The method of claim 10, further comprising generating a continuous wave oscillator (CWO) signal, wherein said generating the desired oscillator signal comprises generating the desired oscillator signal from the CWO signal.

12. The method of claim 11, wherein said generating the desired oscillator signal from the LO signal comprises generating the desired oscillator signal from the CWO signal according to a control value.

13. The method of claim 12, wherein said generating the desired oscillator signal from the CWO signal according to the control value comprises:

converting the control value to a pair of respective analog input signals; and generating the desired oscillator signal by quadrature modulating the pair of analog input signals according to the CWO signal.

14. The method of claim 12, further comprising generating the control value according to a frequency-versus-time function.

15. The method of claim 14, further comprising selecting the frequency-versus-time function from among a plurality of functions in a signal processing unit.

16. The method of claim 14, wherein the frequency-versus-time function is representative of a simple linear frequency sweep.

17. The method of claim 11, further comprising generating the CWO signal by a phase locked loop, and based on a periodic reference signal.

18. The method of claim 10, further comprising determining the amount by which the receive data corresponding to the IF signal is frequency shifted according to various delays present in the signal generating circuit and the downconversion stage.

* * * * *